United States Patent
Blum et al.

(10) Patent No.: US 10,418,893 B2
(45) Date of Patent: Sep. 17, 2019

(54) FAST-SWITCHING CIRCUIT ASSEMBLY FOR A CONVERTER

(71) Applicant: Siemens Aktiengesellschaft, Munich (DE)

(72) Inventors: Manuel Blum, Ottobrunn (DE); Walter Kiffe, Kirchheim (DE); Thomas Komma, Ottobrunn (DE); Monika Poebl, Munich (DE); Michael Finkenzeller, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 15/579,314

(22) PCT Filed: Jun. 8, 2016

(86) PCT No.: PCT/EP2016/063053
§ 371 (c)(1),
(2) Date: Dec. 4, 2017

(87) PCT Pub. No.: WO2016/198461
PCT Pub. Date: Dec. 15, 2016

(65) Prior Publication Data
US 2018/0166968 A1 Jun. 14, 2018

(30) Foreign Application Priority Data
Jun. 12, 2015 (DE) .......... 10 2015 210 802

(51) Int. Cl.
*H02M 1/088* (2006.01)
*H02M 7/00* (2006.01)
(Continued)

(52) U.S. Cl.
CPC ............ *H02M 1/088* (2013.01); *H02K 11/33* (2016.01); *H02M 7/003* (2013.01); *H02M 7/493* (2013.01);
(Continued)

(58) Field of Classification Search
CPC ........ H02M 1/08; H02M 1/088; H02M 7/003; H02M 7/493; H03K 1/33; H03K 17/687;
(Continued)

(56) References Cited

U.S. PATENT DOCUMENTS 5,170,337 A 12/1992 Borowiec et al. ............ 363/147
5,731,970 A 3/1998 Mori et al. ..................... 363/132
(Continued)

FOREIGN PATENT DOCUMENTS

| DE | 102012205725 A1 | 10/2013 | ............ H02M 1/00 |
| WO | 2016/198461 A1 | 12/1916 | ............ H02M 1/088 |
| WO | 2014/168607 A1 | 10/2014 | ........... H01L 21/205 |

OTHER PUBLICATIONS

German Office Action, Application No. 102015210802.3, 9 pages, dated Sep. 22, 2015.
(Continued)

*Primary Examiner* — Adolf D Berhane
(74) *Attorney, Agent, or Firm* — Slayden Grubert Beard PLLC

(57) ABSTRACT

The disclosure relates to electrical converters. The teachings thereof may be embodied in a circuit assembly for an electrical converter. For example, a circuit assembly for an electrical converter may include a set of switching units, each switching unit comprising a semiconductor switch and a gate driver circuit for controlling the semiconductor switch. The respective semiconductor switch and gate driver circuit of each switching unit are arranged on a common
(Continued)

carrier circuit board and are electrically connected to one another by a printed conductor on the carrier circuit board.

9 Claims, 3 Drawing Sheets

(51) Int. Cl.
*H02K 11/33* (2016.01)
*H02M 7/493* (2007.01)
*H03K 17/16* (2006.01)
*H03K 17/687* (2006.01)
*H05K 1/02* (2006.01)
*H01L 29/16* (2006.01)
*H01L 29/20* (2006.01)

(52) U.S. Cl.
CPC ......... *H03K 17/161* (2013.01); *H03K 17/687* (2013.01); *H05K 1/0237* (2013.01); *H01L 29/1608* (2013.01); *H01L 29/2003* (2013.01); *H05K 2201/10166* (2013.01)

(58) Field of Classification Search
CPC .... H03K 17/161; H03K 17/68; H05K 1/0237; H05K 2201/10166
See application file for complete search history.

(56) References Cited

U.S. PATENT DOCUMENTS

| 7,138,698 | B2* | 11/2006 | Nakamura | .............. | H02M 1/08 |
| | | | | | 257/491 |
| 2005/0179472 | A1 | 8/2005 | Nakamura et al. | ........... | 327/109 |
| 2013/0241520 | A1 | 9/2013 | Kim et al. | ..................... | 323/311 |
| 2017/0162599 | A1* | 6/2017 | Koide | ................... | H01L 27/124 |
| 2017/0285815 | A1* | 10/2017 | Yamazaki | ............. | G06F 3/0412 |
| 2018/0012538 | A1* | 1/2018 | Asami | .................. | G11C 11/412 |
| 2018/0018565 | A1* | 1/2018 | Kurokawa | .............. | G06N 3/08 |
| 2018/0151593 | A1* | 5/2018 | Inoue | ................... | H01L 27/124 |

OTHER PUBLICATIONS

International Search Report and Written Opinion, Application No. PCT/EP2016/063053, 12 pages, dated Sep. 9, 2016.
Hofer, Patrick et al., "Paralleling Intelligent IGBT Power Modules with Active Gate-Controlled Current Balancing," IEEE Power Electronics Specialists Conference, URL: http://ieeexplore.ieee.org/stamp/stamp.jsp?tp=&arnumber=548751&tag=1, pp. 1312-1316, 1996.
European Office Action, Application No. 16729845.4, 5 pages, dated Aug. 31, 2018.

* cited by examiner

FAST-SWITCHING CIRCUIT ASSEMBLY FOR A CONVERTER

CROSS-REFERENCE TO RELATED APPLICATIONS

This application is a U.S. National Stage Application of International Application No. PCT/EP2016/063053 filed Jun. 8, 2016, which designates the United States of America, and claims priority to DE Application No. 10 2015 210 802.3 filed Jun. 12, 2015, the contents of which are hereby incorporated by reference in their entirety.

TECHNICAL FIELD

The disclosure relates to electrical converters. The teachings thereof may be embodied in a circuit assembly for an electrical converter.

BACKGROUND

In converters for power electronic applications, the semiconductor switches of the rectifier and/or inverter of a converter are usually configured in modular form. A module of this type comprises, for example, three half-bridges, comprising semiconductor switches. To control of the semiconductor switches, this module is connected to a separate circuit board where the gate driver circuits for the semiconductor switches are. The circuit board is connected to control inputs on the module by means of wires. Within the module, the control inputs are connected to the gates of the semiconductor switches by means of bonding wires.

The in-module wiring inductances associated with this modular system limit the maximum potential switching frequency at which the semiconductor switches can be switched. If the maximum switching frequency is exceeded, wiring inductances result in induction of overvoltages. To prevent damage to the semiconductor, the switching frequency and the operating speed (the transition between the conducting and the non-conducting switching state) must be restricted.

SUMMARY

The teachings of the present disclosure may be embodied in converters with a high switching frequency and/or operating speed. For example, a circuit assembly may comprise a plurality of switching units, each having a semiconductor switch and a gate driver circuit for controlling the semiconductor switch. Some embodiments may include an electrical converter having the circuit assembly described herein.

For example, a circuit assembly (20) for an electrical converter (1), may include switching units (15), each having a semiconductor switch (16) and a gate driver circuit (17) for controlling the semiconductor switch (16). In each switching unit (15), the respective semiconductor switch (16) and gate driver circuit (17) are arranged on a common carrier circuit board (21), and the gate driver circuit (17) is electrically connected to the gate (G) of the semiconductor switch (16) by means of at least one printed conductor (23) on the carrier circuit board (21).

In some embodiments, in the switching units (15), the respective clearance (18) between the gate driver circuit (17) and the gate (G) is smaller than 2 centimeters, and specifically smaller than 1 centimeter.

In some embodiments, the semiconductor switches (16) of the switching units (15) are based upon a wide-bandgap semiconductor technology, and are specifically based on silicon carbide and/or gallium nitride.

In some embodiments, a logic circuit (24) is interconnected with the respective gate driver circuit (17) of the at least two parallel-connected switching units (15) and is designed for the simultaneous actuation of the gate driver circuits (17), in response to a switching signal (25).

In some embodiments, at least two of the switching units (15) are arranged on the same carrier circuit board (21).

In some embodiments, the semiconductor switches (16) of the switching units (15) are each constituted as a discrete component, which is soldered to the circuit board (21).

In some embodiments, in at least one of the switching units (15), a snubber circuit (26) is connected in parallel with the switching gap of the semiconductor switch (16).

In some embodiments, at least one of the switching units (15), the carrier circuit board (21) incorporates an IMS, or insulated metal substrate.

Some embodiments may include a converter (1), wherein an inverter (4) and/or a rectifier (2) respectively comprise a circuit assembly (20) as described above.

In some embodiments, a control device (5) is designed to operate the respective circuit assemblies (20) of the inverter (4) and/or of the rectifier (2) at a switching frequency which is greater than 50 kHz.

BRIEF DESCRIPTION OF THE DRAWINGS

Exemplary embodiments are described hereinafter. To this end.

DETAILED DESCRIPTION

Figure 1:
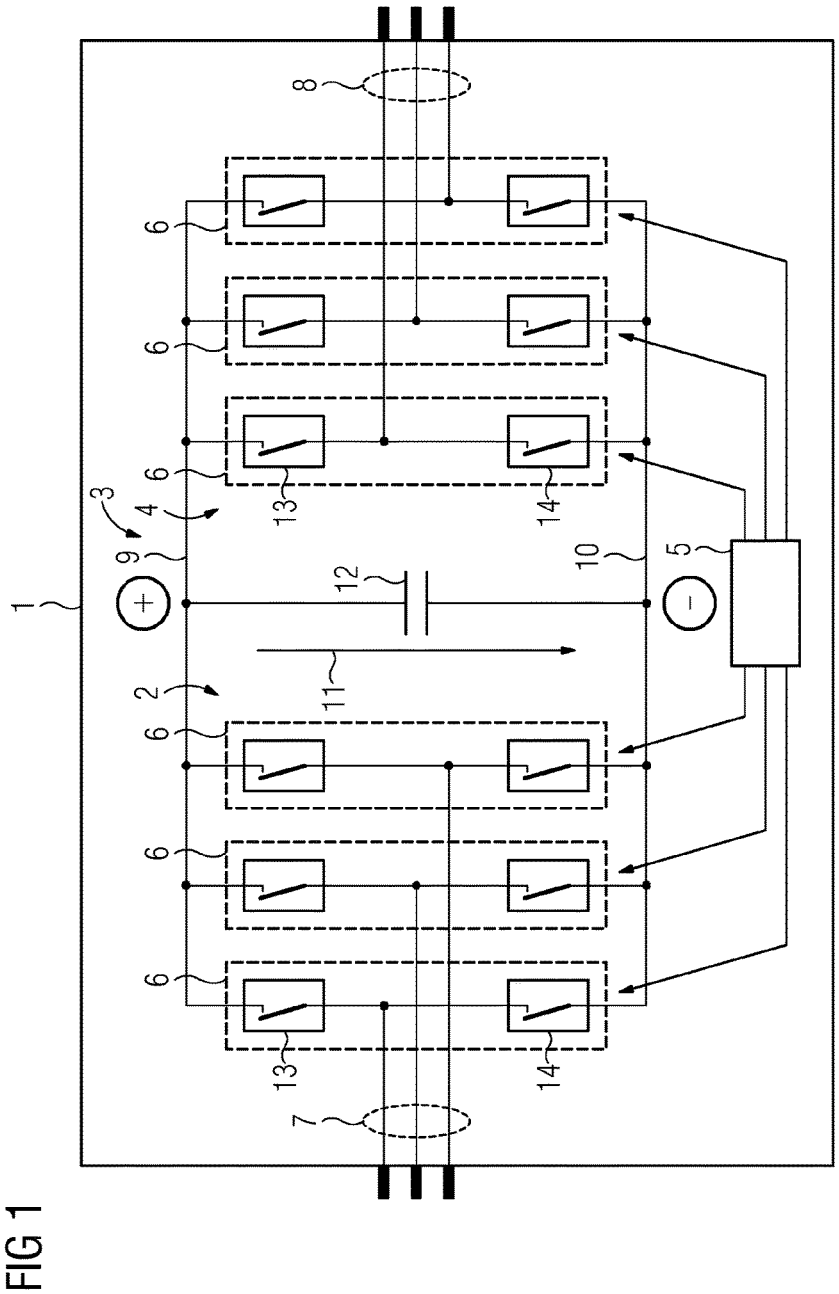
FIG. 1 shows a schematic representation of one form of embodiment of the converter according to teachings of the present disclosure.

The teachings of the present disclosure may be embodied in a circuit assembly for an electrical converter. In some embodiments, one semiconductor switch and its associated gate driver circuit respectively are combined to form a switching unit for controlling the semiconductor switch. To permit the rapid switching of this switching unit, e.g. the operation thereof at a high switching frequency and/or high operating speed, in each switching unit, the respective semiconductor switch and gate driver circuit are arranged on a common carrier circuit board, and the gate driver circuit is electrically connected to the gate of the semiconductor switch by means of at least one printed conductor on the carrier circuit board.

In some embodiments, it is not necessary for the gate driver circuit to be connected to a module by means of a wire, such that a further bonding wire is required to form the connection to the gate of the semiconductor switch within the module. This relatively long circuit path between the gate driver circuit and the gate results in the aforementioned wiring inductance. Conversely, by the common arrangement thereof on the carrier circuit board, the gate driver circuit and the gate are arranged with a small clearance, such that the conductor path does not generate any significant increase in the inductance.

In some embodiments, the wiring inductance between the gate driver circuit and the gate in each switching unit no longer constitutes the limiting factor for the setting of the maximum switching frequency and/or operating speed. The circuit assembly can thus be operated with more rapid switching than a conventional converter circuit assembly, which is based upon the module described at the outset. Rapid switching is specifically understood as a switching frequency in excess of 50 kHz.

In some embodiments, the circuit assembly is configured as a power electronic application, e.g. each semiconductor switch is designed to conduct or switch a rated current greater than 10 A, and/or greater than 50 A, via its switching gap (drain-source connection). A blocking voltage for the switching gap of each semiconductor switch may be greater than 100 V.

In some embodiments, a particularly low wiring inductance results when the respective clearance between the gate driver circuit and the gate of the semiconductor switch is smaller than 2 centimeters, and/or smaller than 1 centimeter.

In some embodiments, the semiconductor switches of the switching units incorporate a wide-bandgap semiconductor technology. Specifically, the semiconductor switches comprise silicon carbide and/or gallium nitride. In such embodiments, the semiconductor switches have a higher switching frequency and/or operating speed than, for example, silicon semiconductor switches. The semiconductor switches may comprise IGBTs (insulated gate bipolar transistors) or MOSFETs (metal oxide semiconductor field effect transistors). Thus, the semiconductor switch itself is operable at a higher maximum frequency than a conventional silicon-based semiconductor switch.

Some embodiments permit the switching of a particularly high current. To this end, at least two of the switching units are switched in parallel. However, to permit synchronous switching, notwithstanding the distributed arrangement of the gate driver circuits of these two switching units, a central logic circuit is interconnected with the respective gate driver circuit of the at least two parallel-connected switching units. The logic circuit is designed for the simultaneous actuation of the gate driver circuits, in response to a switching signal. In this arrangement, the central logic circuit can be arranged with a greater clearance to the two gate driver circuits, as there are no resulting issues associated with the wiring inductance. In an advantageous manner, central control of the gate driver circuits is thus permitted, but with the prevention of any influence of wiring inductances associated with the arrangement of gate driver circuits on the semiconductor switches.

The switching units do not need to be arranged on separate circuit boards. Instead, in some embodiments, at least two of the switching units are arranged on the same carrier circuit board. This provides an advantage, in that an exceptionally space-saving circuit arrangement can be achieved. In conjunction with the parallel-connected switching units, an advantage is provided, in that the distribution of the switched current can be achieved by means of the carrier circuit boards.

In some embodiments, to execute the circuit assembly in the least complex form possible, the semiconductor switches of the switching units are each constituted as a discrete component. This component thus constitutes a semiconductor switch, which is arranged in a dedicated housing. This component is then soldered to the circuit board.

In some embodiments, in at least one of the switching units, a snubber circuit is connected in parallel with the switching gap of the semiconductor switch. A snubber circuit can be constituted, for example, as an RC element. This has an advantage, in that further inductances can be compensated.

In some embodiments, the semiconductor switches of the switching units, and specifically also the snubber circuit, can generate heat, which must be evacuated. In some embodiments, in at least one of the switching units, the carrier circuit board incorporates an IMS (insulated metal substrate). This provides an advantage in that, by means of the insulation, heat can be evacuated via the metal of the IMS. Specifically, the IMS is employed in combination with the snubber circuit.

In some embodiments, for the suppression of oscillations between parallel-connected semiconductor switches, the parallel-connected semiconductor switches are constituted by switching units which are arranged on a common carrier circuit board. Accordingly, by the arrangement of the switching units on the carrier circuit board, and the resulting current path lengths, an oscillation-damping effect can be achieved. A further influencing parameter upon the tendency to oscillation, or upon the oscillatory characteristics of parallel-connected semiconductors, is the selection of actuation signals or control signals for the gates. In some embodiments, there is a converter, in which the inverter and/or the rectifier each incorporate a circuit assembly which constitutes one form of embodiment of the circuit assembly. The converter can be operated in a fast-switching manner, with no resulting damage to the semiconductor switches of the switching units associated with induced overvoltages. In some embodiments, a control device of the converter operates the respective circuit assemblies of the inverter and/or of the rectifier at a switching frequency which is greater than 50 kHz. Conversely, conventional converters are only capable of operating with a switching frequency of less than 20 kHz.

In the exemplary embodiments, the components of the forms of embodiment described each constitute individual and mutually independent characteristics of the invention, each of which further develop the teachings in a likewise mutually independent manner and thus, either individually or in a combination other than that described, are to be considered as constituent elements. Moreover, the forms of embodiment represented also can be expanded by the inclusion of more of the characteristics already described.

In the figures, functionally-equivalent components are provided with the same reference symbols in each case.

FIG. 1 shows an example converter 1 with a rectifier 2, a direct voltage intermediate circuit 3, an inverter 4, and a control device 5. The rectifier 2 and the inverter 4 each incorporate half-bridges 6, by means of which alternating voltage phase conductors 7, 8, of the inverter 1 are interconnected with both a positive conductor 9 and a negative conductor 10 of the intermediate circuit 3. In the rectifier 2, by means of the half-bridges 6, a direct voltage can be generated in the intermediate circuit 3 from the alternating voltages on the phase conductors 7, which can be buffered in an intermediate circuit capacitor 12. By the use of the inverter 4, by means of the half-bridges 6, alternating voltages can be generated in the respective phase conductors 8 from the direct voltage 11.

The converter 1 can be employed, for example, for the operation of an electrical machine, for example a synchronous machine. To this end, the converter 1 can be interconnected with an electric power supply grid via the phase conductors 7, and interconnected with the electrical machine via the phase conductors 8.

In the converter 1, the half-bridges 6 are switched or actuated by the control device 5. The switching device 5 may include, for example, of electrical and electronic components. In each case, a separate control device can also be provided for the rectifier 2 and the inverter 4. The switching device 5 may comprise, for example, a microprocessor or an ASIC (application specific integrated circuit).

Each of the half-bridges incorporates a "high-side circuit" 13 and a "low-side circuit" 14, of which only some are marked with a reference figure in FIG. 1, in the interests of clarity. In each case, the circuits 13, 14 can comprise one, or a parallel-connected arrangement of a plurality of semiconductor switches.

Figure 2:
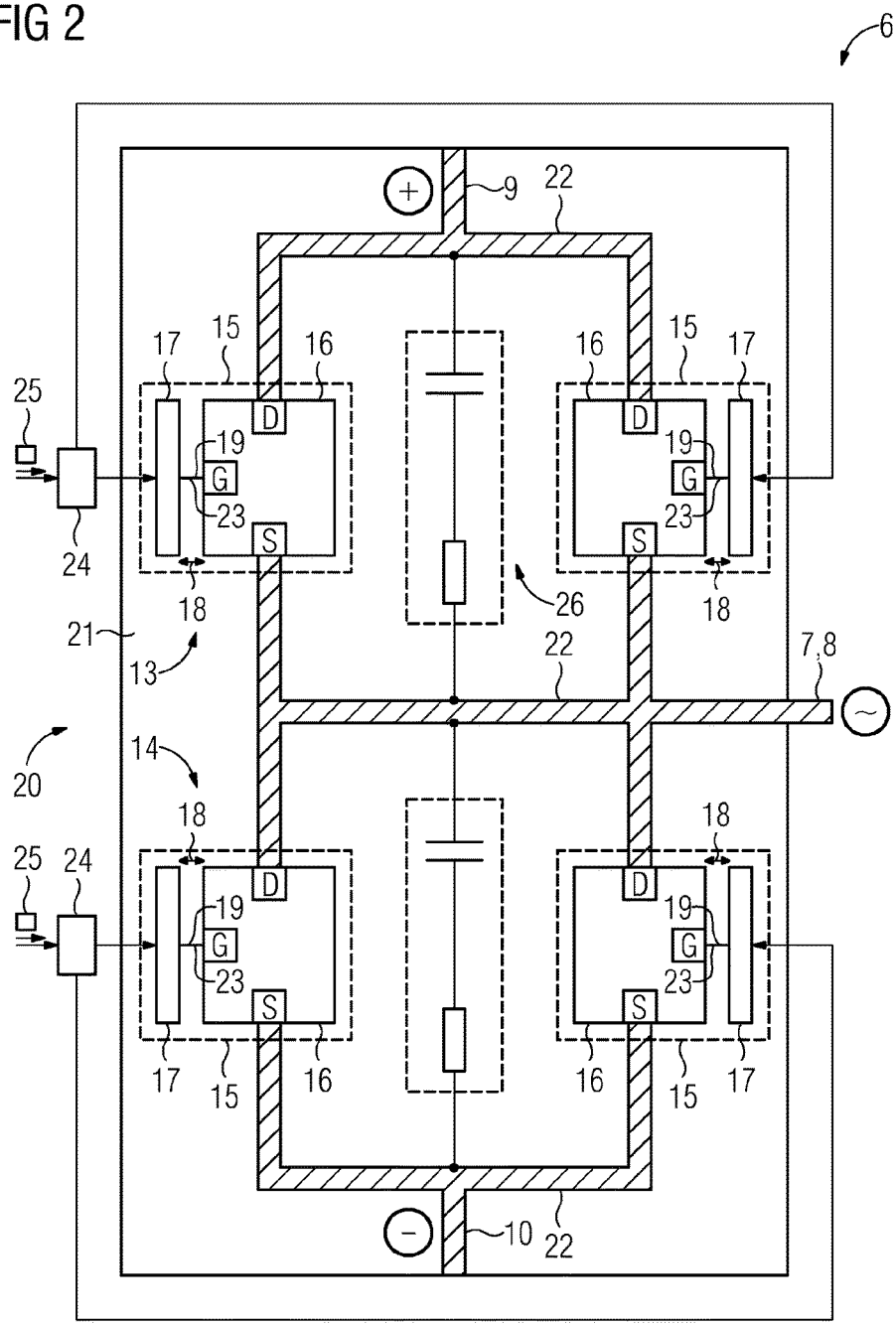
FIG. 2 shows a schematic representation of one form of embodiment of the circuit assembly according to teachings of the present disclosure.

FIG. 2 represents a half-bridge 6 once again in greater detail. In the example represented in FIG. 2, the high-side circuit 13 and the low-side circuit 14 each comprise parallel-connected switching units 15. Each switching unit 15 comprises a semiconductor switch 16 and a gate driver circuit, or driver circuit 17 for short, for the respective semiconductor switch 16. For illustrative purposes, the respective drain D, source S and gate G terminals of the semiconductor switches 16 are represented. The semiconductor switches 16 can, for example, be an IGBT or a MOSFET in each case. The semiconductor switches 16 may include a wide-bandgap semiconductor, and may comprise silicon carbide- and/or gallium nitride-based semiconductor switches or transistors.

The gate driver circuits can each comprise a gate driver. By means of the gate driver circuit, upon the switching of the respective semiconductor switch 16, a gate capacitance of the gate G is transferred. In the half-bridges 6 of the converter 1, this is possible at a particularly high switching frequency and/or operating speed. Specifically, a switching frequency in excess of 50 kHz is possible.

To this end, a clearance 18 between the driver circuits 17 and the associated semiconductor switch 16 may be sufficiently small such that a control conductor 19, by means of which the driver circuit 17 is connected to the gate G, is configured with a short length, and thus generates a low wiring inductance. Specifically, the clearance 18 may be less than 2 centimeters.

To achieve this low-inductance arrangement of the driver circuit 17 and the semiconductor switch 16, in the example represented in FIG. 2, the half-bridge 6 is configured as a circuit assembly 20. In some embodiments, in each switching unit 15, the driver circuit 17 and the semiconductor switch 16 are arranged on a common carrier circuit board 21. In the example represented in FIG. 2, all the switching units 15 are arranged on a common carrier circuit board 21. The carrier circuit board 21 may comprise a PCB (printed circuit board). The carrier circuit board 21 may comprise an IMS.

In some embodiments, printed conductors 22, or copper printed conductors, or aluminum printed conductors, may be disposed on the carrier circuit board 21, by means of which a connection of the switching units 15 with the positive conductor 9, the negative conductor 10 and the respective phase conductors 7, 8 can be formed. In the circuit assembly 8, specifically, the control conductor 19 includes a printed conductor 23 on the carrier circuit board 21.

In some embodiments, for the simultaneous switching of the respective parallel-connected semiconductor switches 16 by means of the driver circuit 17 thereof, the circuit assembly 20 can respectively comprise a driver logic circuit or logic circuit 24, which relays a control signal 25 from the control unit 5 to the two driver circuits 17 of the parallel-connected switching units 15. The logic circuit 24 can incorporate a control circuit for the coordination of the switching instants of the switching units 15.

In some embodiments, a snubber circuit 26 can be connected in parallel with the parallel-connected semiconductor switches 16. A respective snubber circuit 26 can be provided for each semiconductor switch 16, or a common snubber circuit 26 can be provided. A snubber circuit 26 may comprise, for example, a snubber capacitor, or by an RC element, or by a capacitor alone.

In some embodiments, the circuit assembly 20 may conduct a current with a current strength in a region in excess of 50 A, and/or in excess of 100 A. By means of the parallel circuit represented, it is possible in this way for each semiconductor switch 16 to be designed for the conduction of a partial current as its nominal current, such that the nominal current of each semiconductor switch 16 is smaller than the nominal current of the circuit assembly 25. In some embodiments, a blocking voltage of the semiconductor switches 16 can be greater than 100 V.

In some embodiments, the driver circuits 17 are coupled to the control device 5 via a galvanic isolating device, e.g. an optical coupler. By this arrangement, even at high blocking voltages on the drain-source switching gaps of the semiconductor switches 16, and notwithstanding the proximity of the driver circuit 17, an overshoot of the blocking voltage on the control devices can be prevented.

Figure 3:
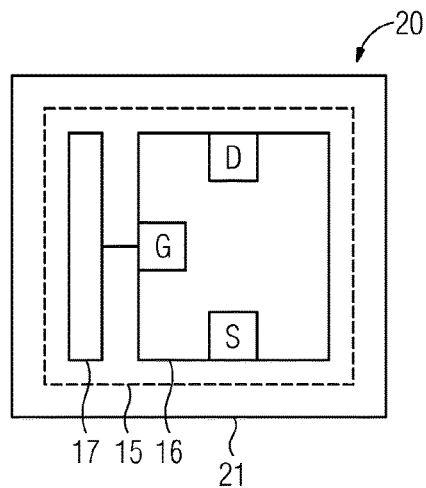
FIG. 3 shows a schematic representation of an alternative form of embodiment of the circuit assembly according to teachings of the present disclosure.

Another embodiment of the circuit arrangement is represented in FIG. 3. In this circuit arrangement 20, a single switching unit 15, with a semiconductor switch 16 and a driver circuit 17, is arranged on a dedicated carrier circuit board 21, with no further switching unit 15. The carrier circuit board 21 can be configured in the same manner as described above with reference to FIG. 2. This arrangement has an advantage, in that the rectifier 7 or the inverter 8 based upon the circuit assembly 20 according to FIG. 3 can be adapted to the available structural space in a particularly flexible manner.

Figure 4:
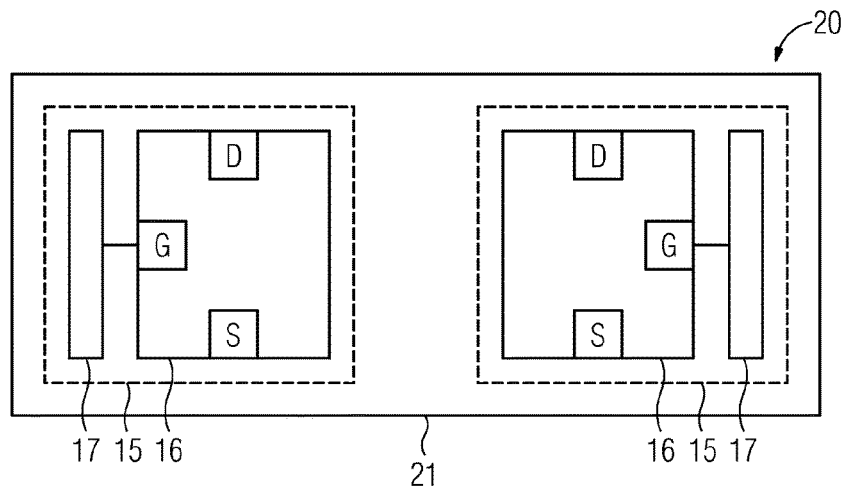
FIG. 4 shows a schematic representation of a further form of embodiment of the circuit assembly according to teachings of the present disclosure.

FIG. 4 shows a further embodiment of the circuit assembly 20, in which two switching units 15 are arranged on a common carrier circuit board 21. By means of (unrepresented) printed conductors on the carrier circuit board 21, the switching units 15 can be connected in parallel. In some embodiments, more than two switching units 15 are disposed on a common carrier circuit board 21, in the form of a parallel circuit. In this arrangement, by the selection of the number of switching units, it is possible to set the magnitude of the nominal current which can be switched by the circuit assembly 20.

The examples illustrate that it is not necessary for semiconductor switches 16 to be configured as a separate, one-part module, which must then be interconnected with a further circuit boards, on which all the driver circuits for the semiconductor switches of the entire module are arranged. In place of a single large module, discrete power semiconductors are interconnected on a circuit board, and are connected to a separate driver in a low-inductance arrangement. By means of the low-inductance connection, switching overvoltages can be prevented, and the operating speed increased. Oscillation between the parallel-connected semiconductors is prevented by the optimized layout of the printed conductors 22, 23, and by the correct execution of control by the control units. Ideally, as required, snubber circuits can be associated with the semiconductor and, by the use of IMS, heat evacuation can ideally be provided in addition.

By means of an optimum layout of drivers and power semiconductors, an increase in the switching frequency is possible, even for larger power ratings. The combination of low-inductance semiconductor housings, IMS printed circuit board technology and customized driver peripherals thus permits the exploitation of advantages which are specifically associated with wide-bandgap semiconductors. Overall, this example demonstrates how a HF converter module can be provided by means of the invention.

What is claimed is:

1. A circuit assembly for an electrical converter, the assembly comprising:
   a set of switching units, each switching unit comprising a semiconductor switch and a gate driver circuit for controlling the semiconductor switch;
   wherein:
      the respective semiconductor switch and gate driver circuit of each switching unit are arranged on a common carrier circuit board and are electrically connected to one another by a printed conductor on the carrier circuit board; and
      the circuit assembly further comprises a logic circuit interconnected with each respective gate driver circuit at least two parallel-connected switching units for simultaneous actuation of the gate driver circuits in response to a switching signal.

2. The circuit assembly as claimed in claim 1, wherein a respective clearance between a respective gate driver circuit and respective gate is smaller than 2 centimeters.

3. The circuit assembly as claimed in claim 1, wherein each semiconductor switches comprises a wide-bandgap semiconductor technology.

4. The circuit assembly as claimed in claim 1, wherein at least two of the switching units are arranged on a single carrier circuit board.

5. The circuit assembly as claimed in claim 1, wherein the semiconductor switches each comprise a discrete component.

6. The circuit assembly as claimed in claim 1, further comprising a snubber circuit connected in parallel with the switching gap of the semiconductor switch in at least one of the switching units.

7. The circuit assembly as claimed in claim 1, wherein the carrier circuit board comprises an insulated metal substrate.

8. A converter comprises an inverter or a rectifier, the converter comprising:
   a set of switching units, each switching unit comprising a semiconductor switch and a gate driver circuit for controlling the semiconductor switch;
   wherein:
      the respective semiconductor switch and gate driver circuit of each switching unit are arranged on a common carrier circuit board and are electrically connected to one another by a printed conductor on the carrier circuit board; and
      the converter further comprises a logic circuit interconnected with each respective gate driver circuit at least two parallel-connected switching units for simultaneous actuation of the gate driver circuits in response to a switching signal.

9. The converter as claimed in claim 8, further comprising a control device to operate the respective circuit assemblies of at a switching frequency which is greater than 50 kHz.

* * * * *